United States Patent
Zheng et al.

(10) Patent No.: US 10,008,219 B2
(45) Date of Patent: Jun. 26, 2018

(54) RECORDING READ HEADS WITH A MULTI-LAYER AFM LAYER METHODS AND APPARATUSES

(71) Applicant: Western Digital (Fremont), LLC, Fremont, CA (US)

(72) Inventors: Yuankai Zheng, Fremont, CA (US); Qunwen Leng, Palo Alto, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days. days.

(21) Appl. No.: 15/153,357

(22) Filed: May 12, 2016

(65) Prior Publication Data

US 2016/0260447 A1    Sep. 8, 2016

Related U.S. Application Data

(63) Continuation of application No. 13/923,991, filed on Jun. 21, 2013, now Pat. No. 9,361,913.

(60) Provisional application No. 61/830,238, filed on Jun. 3, 2013.

(51) Int. Cl.
| | | |
|---|---|---|
| H01F 10/10 | (2006.01) |
| G11B 5/127 | (2006.01) |
| G11B 5/31 | (2006.01) |
| H01F 10/13 | (2006.01) |
| C23C 14/14 | (2006.01) |
| H01F 10/32 | (2006.01) |

(52) U.S. Cl.
CPC ............ *G11B 5/1272* (2013.01); *C23C 14/14* (2013.01); *G11B 5/3143* (2013.01); *H01F 10/135* (2013.01); *H01F 10/3218* (2013.01); *H01F 10/3268* (2013.01); *H01F 10/3254* (2013.01)

(58) Field of Classification Search
CPC .. G11B 5/39; G11B 5/66; G11C 11/14; H01L 29/82; H01F 10/002; H01F 10/10
USPC .................. 428/811, 811.3, 810, 811.2, 800
See application file for complete search history.

(56) References Cited

U.S. PATENT DOCUMENTS

| | | | | |
|---|---|---|---|---|
| 2002/0018919 A1* | 2/2002 | Saito | ...................... | B82Y 25/00 428/831.2 |
| 2009/0303605 A1* | 12/2009 | Kirita | .................... | C23C 14/086 359/666 |
| 2010/0103564 A1* | 4/2010 | Nishioka | ................ | B82Y 10/00 360/319 |
| 2010/0173174 A1* | 7/2010 | Imakita | .................. | B82Y 10/00 428/800 |
| 2013/0094108 A1* | 4/2013 | Gao | ..................... | G01R 33/093 360/234.3 |

FOREIGN PATENT DOCUMENTS

JP    411175919    *    7/1999

* cited by examiner

*Primary Examiner* — Tabassom Tadayyon Eslami
(74) *Attorney, Agent, or Firm* — Foley & Lardner LLP

(57) ABSTRACT

Apparatuses and methods of recording read heads with a multi-layer anti-ferromagnetic (AFM) layer are provided. The AFM layer has gradient Manganese (Mn) compositions. A multi-layer AFM layer comprises a plurality of sub-layers having different Mn compositions. An upper sub-layer has a higher Mn composition than an lower sub-layer. Different types of gases may be used to deposit each sub-layer and the flow of each gas may be adjusted.

9 Claims, 2 Drawing Sheets

RECORDING READ HEADS WITH A MULTI-LAYER AFM LAYER METHODS AND APPARATUSES

CROSS-REFERENCE TO RELATED APPLICATIONS

This application is a continuation of U.S. patent application Ser. No. 13/923,991, filed on Jun. 21, 2013, which claims priority to provisional U.S. Patent Application Ser. No. 61/830,238, filed on Jun. 3, 2013, which applications are hereby incorporated by reference in their entireties.

TECHNICAL FIELD

This disclosure relates to the field of magnetic heads, and more specifically, to the recording read heads with a multi-layer anti-ferromagnetic (AFM) AFM layer methods and apparatuses.

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a magnetic hard disk drive, the head typically comprises a free layer, a spacer, a pinned layer, and an exchange layer. The free layer is the sensing layer that is passed over the surface of the data bits to be read. The free layer is free to rotate in response to the magnetic patterns on the disk. The spacer is a nonmagnetic layer that separates the magnetization of the free and pinned layers. The pinned layer is usually held in a fixed magnetic orientation by its proximity to the exchange layer, which is a layer of antiferromagnetic material that fixes the pinned layer's magnetic orientation.

BRIEF DESCRIPTION OF THE DRAWINGS

The present application is illustrated by way of example, and not limitation, in the figures of the accompanying drawings in which.

DETAILED DESCRIPTION

The area density of the magnetic recording hard disk has been increasing. To meet the requirement of the track density and linear density, both smaller reader width and gap width are needed, affecting the AFM layer to have a smaller volume. As a result, due to a low Blocking Temperature Dispersion (TbD) in a small Magnetic Tunnel Junction (MTJ) device, the thermal stability of the pinned layer may worsen. In addition, the pinning strength or exchange filed need to increase to maintain the pinned layer stable.

Figure 1:
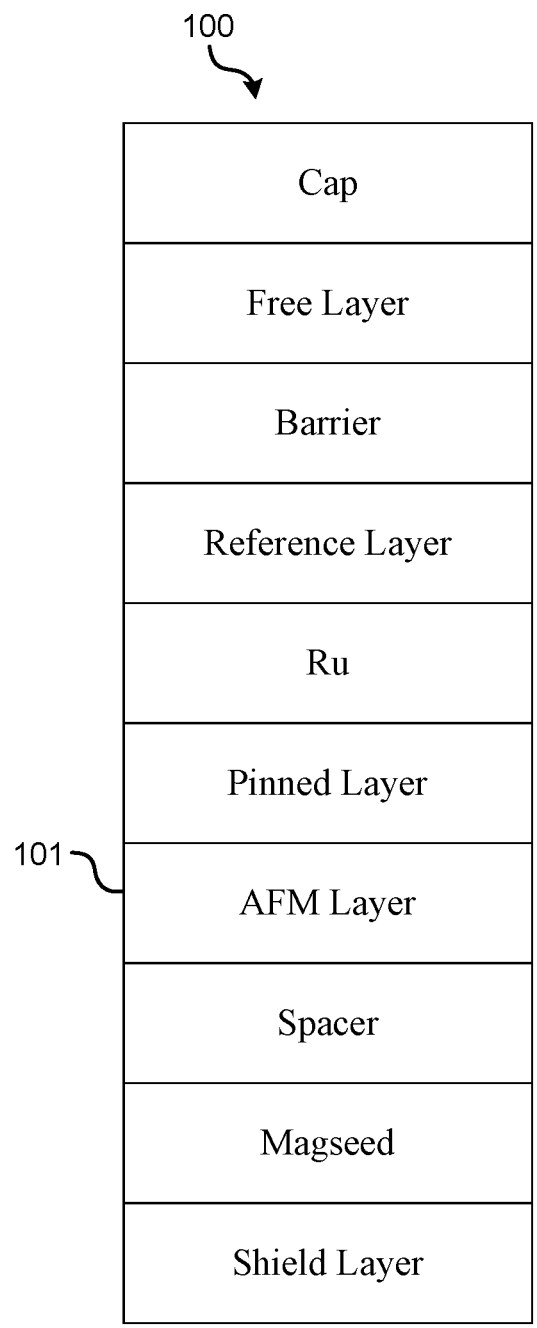
FIG. 1 illustrates a prior art read head film stack.

FIG. 1 illustrates a prior art read head 100 film stack. As illustrated, the read head 100 comprises an AFM layer 102 having only one layer of AFM layer 101. The AFM layer 102 uses an iridium manganese (IrMn) film (e.g., an IrMn film having 75% of Mn composition). The AFM layer 102 is usually deposited by using Argon (Ar) gas.

The prior art read head 100 has some disadvantages. First, it is difficult to maintain a large exchange field (Hex) and a high TbD. A larger grain size is required to keep a high TbD, which causes Hex to drop. Second, the Mn composition of the IrMn film is not uniform due to the interface diffusion. On the surface of the film, the Mn composition is much lower than the center. As such, the performance of the read head is greatly affected.

In the following description, numerous specific details are set forth to provide a thorough understanding of various embodiment of the present application. It will be apparent however, to one skilled in the art that these specific details need not be employed to practice various embodiments of the present application. In other instances, well known components or methods have not been described in detail to avoid unnecessarily obscuring various embodiments of the present application.

The terms "leading," and "trailing" refer to the direction of flight of the slider. The terms "inner" and "outer" refer to the disk radial direction when the slider is flying. The term "depth" refers to distance perpendicular to the plane of flight from the slider surface closest to the disk surface.

Apparatuses and methods of recording read heads with a multi-layer anti-ferromagnetic (AFM) layer are provided. The AFM layer has gradient Manganese (Mn) compositions. Various embodiments comprise a multi-layer AFM layer comprising multiple AFM sub-layers having different Mn compositions. In some embodiments, an upper AFM sub-layer has a higher Mn composition than a lower AFM sub-layer. Each AFM sub-layer may comprise a layer of film. These layers of films may be deposited from the same target (e.g., an IrMn target). Different film compositions with a big range may be obtained from the same target by using Krypton (Kr) gas. In various embodiments, different types of gases may be used to deposit each sub-layer and the flow of each gas may be adjusted.

In some embodiments, the AFM layer comprises two layers of films: 1) a first layer of IrMn film of which the Mn composition is less than 77%, and 2) a second layer of IrMn film of which the Mn composition is between 77% to 84%. Argon (Ar) gas and Krypton (Kr) gas may be used for depositing the first layer and the second layer, respectively. Various embodiments may provide both a large exchange field (Hex) and a good Ruthenium (Ru) Synthetic Anti-ferromagnetic (SAF). Some embodiments with a bi-layer AFM layer may provide both a large Hex and a high Tbd (a larger grain size and good orientation).

Figure 2:
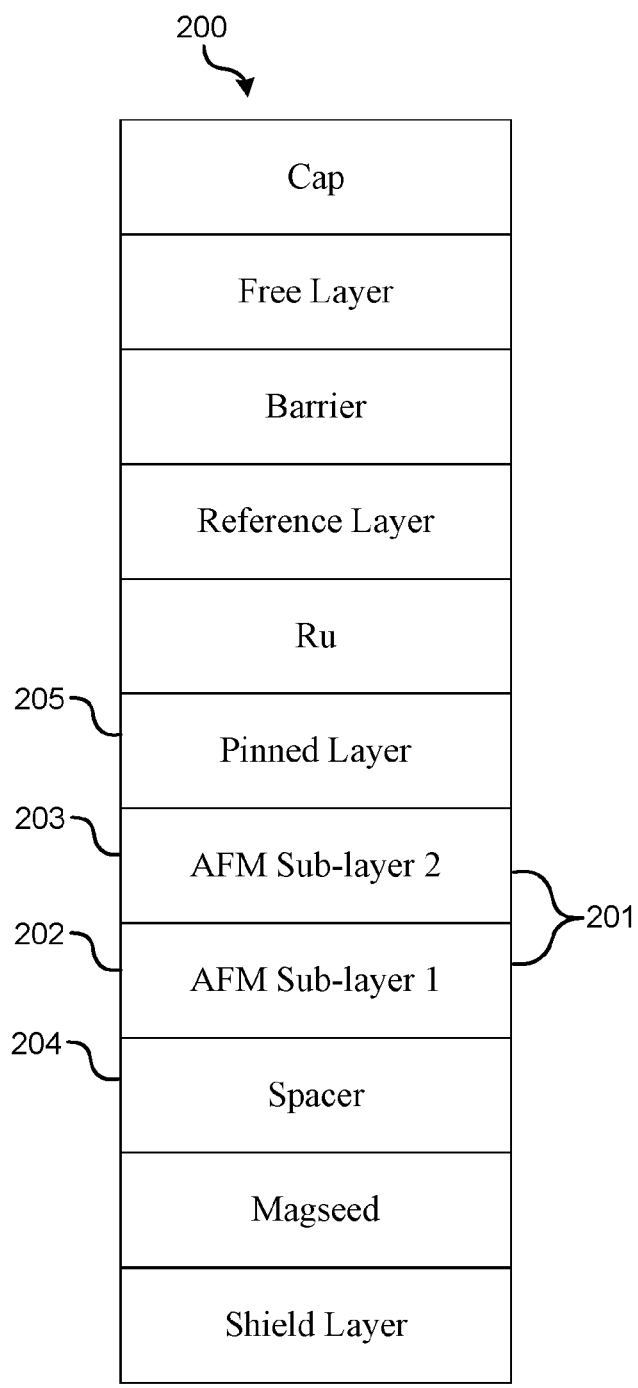
FIG. 2 illustrates an example read head with a multi-layer AFM layer film stack in accordance with an embodiment.

FIG. 2 illustrates an example read head 200 with a multi-layer AFM layer 201 film stack in accordance with an embodiment. In the illustrated example, the illustrated read head 200 comprises a multi-layer AFM layer 201. The multi-layer AFM layer 201 comprises a first AFM sub-layer 202 and a second AFM sub-layer 203. One of ordinary skill in the art would understand that a multi-layer AFM layer may have two or more AFM sub-layers. As illustrated, in the read head 200, the multi-layer AFM layer 201 is sandwiched between a spacer 204 and a pinned layer 205.

In various embodiments, the multi-layer AFM layer has a gradient Manganese (Mn) composition. Each AFM sub-layer may comprise a Manganese alloy film. In some embodiments, an iridium manganese (IrMn) films may be used as an AFM sub-layer. Different AFM sub-layers have different Mn compositions. In some embodiments, a lower-level AFM sub-layer has a lower Mn composition than an upper-level AFM sub-layer. As such, a multi-layer structure is provided because a sub-layer having a lower Mn composition has good orientation.

In one embodiment, the first AFM sub-layer 202 comprises a first IrMn film, of which the Mn composition is less than 77%. The second AFM sub-layer 203 comprises a second IrMn film, of which the Mn composition is between 77% and 84%. In various embodiments, when fabricating a multi-layer AFM layer, the AFM sub-layers may be deposited from the same target (e.g., an IrMn target). For example, a first IrMn film and a second IrMn film may be deposited from the same target. Different types of gases may be used when depositing different AFM sub-layers. In some embodiments, the first AFM sub-layer 202 is deposited using Argon (Ar) gas and the second AFM sub-layer 203 is deposited using Krypton (Kr) gas.

The flow rate of different types of gases may be adjusted. The flow rate may affect the Mn composition of different AFM sub-layers. For example, the Mn composition may be insensitive to the flow rate of Ar gas, but very sensitive to the flow rate of Kr gas. In addition, by using Kr gas, the Mn composition can be controlled to be higher than the target's Mn composition. As such, the Mn composition of each AFM sub-layer may be adjusted to provide a multi-layer AFM layer having a gradient Mn composition.

In various embodiments, a multi-layer AFM layer is sandwiched between a spacer and a pinned layer. In some embodiments, the first AFM sub-layer 202 is deposited onto the spacer 204 and the second AFM sub-layer 203 is deposited onto the first AFM sub-layer 202.

Table 1 illustrates the performance of a bi-layer AFM layer and a full stack with different film structures in accordance with various embodiments. As illustrated, the embodiment with the AFM layer that has a single IrMn film with 76% Mn composition has a low Hex for the AFM layer. The embodiment with the AFM layer that has a single IrMn film with 79% Mn composition has a low Hex for the full stack, which indicates that the Ru SAF is weak. However, the embodiment with a bi-layer AFM layer comprising a first layer of IrMn film with 76% Mn composition and 28 Å thickness and a second layer of IrMn film with 79% Mn composition and 30 Å thickness, provides a high Hex for both the AFM layer and the full stack. As such, a large exchange field (Hex) and a strong Ru SAF are both achieved.

TABLE 1

| | | AFM/Pin bi-layer | | Full Stack | |
|---|---|---|---|---|---|
| t_IrMn76% (A) | t_IrMn79% (A) | Hcp (Oe) | Hex (Oe) | H's (Oe) | Hex (Oe) |
| 28 | 30 | 257 | 1830 | 3243 | −5549 |
| 58 | 0 | 299 | 1458 | 3188 | −5392 |
| 0 | 58 | 278 | 1710 | 3455 | −3917 |

In the foregoing specification, embodiments of the application have been described with reference to specific exemplary features thereof. It will, however, be evident that various modifications and changes may be made thereto without departing from the broader spirit and scope of the application as set forth in the appended claims. The specification and figures are, accordingly, to be regarded in an illustrative rather than a restrictive sense.

What is claimed is:

1. A method of manufacturing a read head, comprising:
fabricating a multi-layer anti-ferromagnetic (AFM) layer, the multi-layer AFM layer comprising a first AFM sub-layer and a second AFM sub-layer, the first AFM sub-layer and the second AFM sub-layer having different Manganese (Mn) compositions, wherein the fabricating the multi-layer AFM layer comprises:
depositing the first AFM sub-layer from a target using a first sputtering gas, and
depositing the second AFM sub-layer on top of the first AFM sub-layer from the target using a second sputtering gas, the second sputtering gas different from the first sputtering gas; and
sandwiching the multi-layer AFM layer between a pinned layer and a spacer layer:
wherein the second AFM sub-layer has a higher Mn composition than the first AFM sub-layer: and wherein the first AFM sub-layer is disposed directly on the spacer layer, the second AFM sub-layer is disposed directly on the first AFM sub-layer, and the pinned layer is disposed directly on the second AFM sub-layer.

2. The method of claim 1, wherein the AFM layer has gradient Manganese (Mn) compositions.

3. The method of claim 1, wherein the first AFM sub-layer comprises a first iridium manganese (IrMn) film and the second AFM sub-layer comprises a second IrMn film.

4. The method of claim 3, wherein the Mn composition of the second Mn film is between 77% to 84%.

5. The method of claim 3, wherein the Mn composition of the first IrMn film is less than 77%.

6. The method of claim 1, wherein the first sputtering gas is Argon gas and the second sputtering gas is Krypton gas.

7. The method of claim 1, wherein the graded multi-layer AFM layer is obtained by controlling a first gas flow rate of the first sputtering gas and a second gflow rate of the second sputtering gas.

8. The method of claim 7, wherein a first Mn composition of the first AFM sub-layer is insensitive to the first gas flow rate of the first sputtering gas, and a second Mn composition of the second AFM sub-layer is sensitive to the second gas flow rate of the second sputtering gas.

9. The method of claim 8, wherein different Mn compositions in the first AFM sub-layer and the second AFM sub-layer is obtain by controlling the first gas flow rate and the second gas flow rate.

* * * * *